(12) United States Patent
Otsuka et al.

(10) Patent No.: US 11,182,669 B2
(45) Date of Patent: Nov. 23, 2021

(54) NEURAL NETWORK CIRCUIT

(71) Applicant: DENSO CORPORATION, Kariya (JP)

(72) Inventors: Shigeki Otsuka, Kariya (JP); Irina Kataeva, Kariya (JP)

(73) Assignee: DENSO CORPORATION, Kariya (JP)

( * ) Notice: Subject to any disclaimer, the term of this patent is extended or adjusted under 35 U.S.C. 154(b) by 324 days.

(21) Appl. No.: 16/550,664

(22) Filed: Aug. 26, 2019

(65) Prior Publication Data
US 2019/0378003 A1    Dec. 12, 2019

Related U.S. Application Data

(63) Continuation of application No. PCT/JP2017/045323, filed on Dec. 18, 2017.

(30) Foreign Application Priority Data

Mar. 3, 2017    (JP) .............................. JP2017-040406

(51) Int. Cl.
*G06N 3/063* (2006.01)
*G06F 11/20* (2006.01)

(52) U.S. Cl.
CPC ......... *G06N 3/063* (2013.01); *G06F 11/2028* (2013.01)

(58) Field of Classification Search
CPC ............................ G06F 11/2028; G06N 3/063
See application file for complete search history.

(56) References Cited

U.S. PATENT DOCUMENTS

| | | | | |
|---|---|---|---|---|
| 5,175,794 A | * | 12/1992 | Tattersall | G06K 9/64 704/200 |
| 5,202,956 A | * | 4/1993 | Mashiko | G06N 3/063 706/39 |
| 5,412,256 A | * | 5/1995 | Alspector | G06N 3/0635 706/38 |
| 6,507,828 B1 | * | 1/2003 | Leonard | G06N 3/063 706/33 |
| 8,566,265 B1 | * | 10/2013 | Cruz-Albrecht | G06N 3/049 706/27 |
| 10,720,217 B1 | * | 7/2020 | Tran | G11C 11/54 |

(Continued)

OTHER PUBLICATIONS

Xiaoxiao Liu, Mengjie et al., "A heterogeneous computing system with memristor-based neuromorphic accelerators" High Performance Extreme Computing Conference, 2014, IEEE.

(Continued)

*Primary Examiner* — Matthew M Kim
*Assistant Examiner* — Matthew N Putaraksa
(74) *Attorney, Agent, or Firm* — Posz Law Group, PLC

(57) ABSTRACT

A neural network circuit is provided. The neural network circuit includes a memory device including memristors connected in a matrix, a controller arranged to control a voltage application device to perform writing, deleting and reading data in the memory device, multiple current-to-voltage (I-V) conversion amplifier circuits arranged to convert currents flowing through the memory elements into voltages and outputting the voltages, and multiple current adjusters respectively corresponding to the I-V conversion amplification circuits, each current adjuster being arranged to adjust a total current value input to a corresponding I-/V conversion amplification circuit to zero.

12 Claims, 17 Drawing Sheets

(56) References Cited

U.S. PATENT DOCUMENTS

| | | | |
|---|---|---|---|
| 2004/0083193 A1* | 4/2004 | Shi | G06N 3/063 |
| | | | 706/26 |
| 2015/0121016 A1 | 4/2015 | Otterstedt et al. | |
| 2016/0020766 A1* | 1/2016 | Miao | H03K 19/0813 |
| | | | 326/37 |
| 2017/0337466 A1* | 11/2017 | Bayat | G06F 3/0655 |
| 2018/0108410 A1* | 4/2018 | Whitaker | G11C 13/0064 |
| 2020/0117997 A1* | 4/2020 | Yao | G06N 3/0635 |
| 2020/0342301 A1* | 10/2020 | Miao | G06N 3/0635 |
| 2021/0280239 A1* | 9/2021 | Tran | G11C 16/0425 |

OTHER PUBLICATIONS

Amirali Ghofrani et al., "Toward Large-Scale Access-Transistor-Free Memristive Crossbars"; IEEE, ASP-DAC, 2015, Department of Electrical and Computer Engineering, University of California, Santa Barbara.

* cited by examiner

FIG. 12

|        | TARGET  | 1st CASE | 2nd CASE | 3rd CASE | 4th CASE |
|--------|---------|----------|----------|----------|----------|
| R1p    | -       | Rmin     | Rmax     | -        | -        |
| R1n    | -       | -        | -        | Rmin     | Rmax     |
| Ipp    | 100 $\mu$A | 1000 $\mu$A | 1 $\mu$A | -      | 91 $\mu$A |
| Ipn    | 10 $\mu$A | 910 $\mu$A | -      | 1000 $\mu$A | 1 $\mu$A |
| Ipp-Ipn | +90 $\mu$A | +90 $\mu$A | +1 $\mu$A | -1000 $\mu$A | +90 $\mu$A |

FIG. 15

|  | TARGET | 1st CASE | 2nd CASE | 3rd CASE | 4th CASE |
|---|---|---|---|---|---|
| R1p | - | Rmin | Rmax | - | - |
| R1n | - | - | - | Rmin | Rmax |
| gm_R1p | 100μS | 1000μS | 1μS | 910μS | 91μS |
| gm_R1n | 10μS | 910μS | 91μS | 1000μS | 1μS |
| △gm | 90μS | 90μS | -90μS | -90μS | 90μS |

FIG. 18

|  | TARGET | 1st CASE | 2nd CASE | 3rd CASE | 4th CASE |
|---|---|---|---|---|---|
| R1p | - | Rmin | Rmax | - | - |
| R1n | - | - | - | Rmin | Rmax |
| gm_R1p | 100μS | 1000μS | 1μS | 1000μS | 1μS |
| gm_R1n | 10μS | 1000μS | 1μS | 1000μS | 1μS |
| △gm | 90μS | 0μS | 0μS | 0μS | 0μS |

NEURAL NETWORK CIRCUIT

CROSS-REFERENCE TO RELATED APPLICATIONS

The present application is a continuation application of International Patent Application No. PCT/JP2017/045323 filed on Dec. 18, 2017, which designated the U.S. and claims the benefit of priority from Japanese Patent Application No. 2017-40406 filed on Mar. 3, 2017. The entire disclosures of all of the above applications are incorporated herein by reference.

TECHNICAL FIELD

The present disclosure relates to a neural network circuit including a memory device in which memristors serving as memory elements are connected in a matrix

BACKGROUND

Studies are ongoing to construct a neural network circuit using a non-volatile two-terminal element called a memristors as a synapse, where conductance value of the memristor is variable. In such a neural network circuit, memristors are arranged in a matrix and voltages are applied to the memristors to generate currents. The combined current is converted to a voltage by a sense amplifier and output as a voltage value after waveform is shaped by an activation function. In the neural network circuit, the memristors act as synapses and the sense amplifiers act as neurons. The sense amplifier performs a product-sum operation to the conductance values of the memristors and the applied voltages.

For a typical non-volatile memory other than the neural network circuit, parity bits and checksums and ECC (Error Check and Correct) are employed to improve reliability of stored data. However, in the case of an analog memory using memristors, since memory cells and computing circuits are integrated, it is difficult to determine a data error in the memory cell during computing.

SUMMARY

The present disclosure provides a neural network circuit that includes memristors as memory elements.

In an aspect of the present disclosure, a neural network circuit comprises: a memory device including memristors being variable resistance elements connected in a matrix, wherein the memristors act as memory elements and resistance values of the memristors provide data of the memory device; a voltage application device arranged to apply bias voltages to the memory device; a controller arranged to control the voltage application device to perform writing, deleting and reading the data in the memory device; a plurality of current-to-voltage (I-V) conversion amplifier circuits arranged to convert currents flowing through the memory elements into voltages and outputting the voltages; and a plurality of current adjusters respectively corresponding to the plurality of I-V conversion amplification circuits, each current adjuster being arranged to adjust a total current value input to a corresponding I-/V conversion amplification circuit to zero.

BRIEF DESCRIPTION OF THE DRAWINGS

Objects, features and advantages of the present disclosure will become more apparent from the following detailed description made with reference to the accompanying drawings. In the drawing:

FIG. 12 is a diagram illustrating first to fourth cases where cells R1p and R1n are non-rewritable;

FIG. 15 is a diagram illustrating first to fourth cases where cells R1p and R1n are non-rewritable;

FIG. 18 is a diagram illustrating first to fourth cases where cells R1p and R1n are non-rewritable;

DETAILED DESCRIPTION

Figure 1:
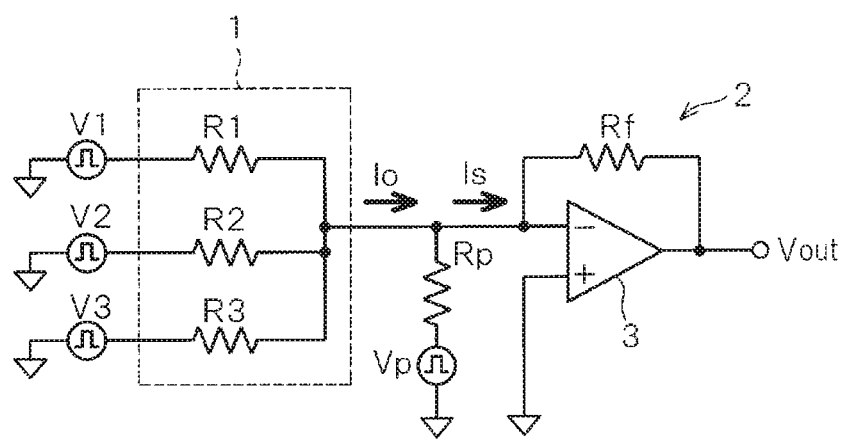
FIG. 1 is a diagram illustrating a configuration for performing error detection to a memory device including memristors in a first embodiment.

First, discussion will be given on a neural network circuit including a memory device in which memristors serving as memory elements are connected in a matrix For a typical non-volatile memory other than the neural network circuit, parity bits and checksums and ECC (Error Check and Correct) are employed to improve reliability of stored data. However, in the case of an analog memory using memristors, since memory cells and computing circuits are integrated, it is difficult to determine a data error in the memory cell during computing.

Without performing error detection during computing, it may be possible to detect errors in such a way that a resistance value of each individual cell is read out and compared with a separately retained reference value. However, this approach takes time.

In addition, the memristors arranged in a matrix may not have an added element for separating elements from each other. In this case, when a defect occurs in one element, there is no choice but to regard all elements connected in the same row or the same column as defective. It is necessary to replace the elements with spare elements on a row or column basis.

In view of this, it is an object of the present disclosure to provide a neural network circuit that includes memristors as memory elements of a memory device and that is capable of easily determining memory element defect.

In an aspect of the present disclosure, a neural network circuit may comprise: a memory device including memristors being variable resistance elements connected in a matrix, wherein the memristors act as memory elements and resistance values of the memristors provide data of the memory device; a voltage application device arranged to apply bias voltages to the memory device; a controller arranged to control the voltage application device to perform writing, deleting and reading the data in the memory device, wherein the writing reduces the resistance value of one or more of the memory elements and the deleting increases the resistance value of one or more of memory elements; a plurality of current-to-voltage (I-V) conversion amplifier circuits arranged to convert currents flowing through the memory elements into voltages and outputting the voltages; and a plurality of current adjusters respectively corresponding to the plurality of I-V conversion amplification circuits, each current adjuster being arranged to adjust a total current value input to a corresponding I-N conversion amplification circuit to zero.

In the above neural network circuit, in accordance with resistance values of respective memory elements connected to a corresponding I-V conversion amplification circuit, the total current value input to the corresponding I-N conversion amplification circuit may be settled, where the resistance values are set to the respective memory elements and depend on writing states of the respective memory elements. Therefore, if the total value is detected as zero after the total value is adjusted to zero with the current adjuster, this indicates that the resistance value set to one or more of the memory elements has changed. Therefore, it is possible to detect an occurrence of abnormality in the memory device.

First Embodiment

As shown in FIG. 1, a memory device 1 includes three memory elements R1, R2, and R3 each being a memristor. Variable voltage sources V1, V2, V3, respectively, are connected to first ends of the memory elements R1, R2, R3. The Variable voltage sources V1, V2, V3 act as voltage application device. Second ends of the memory elements R1, R2 and R3 are commonly connected to an inverting input terminal of an operational amplifier 3, where the inverting input terminal is an input terminal of a sense amplifier 2. A feedback resistor Rf is connected between the inverting input terminal and an output terminal of the operational amplifier 3. A non-inverting input terminal of the operational amplifier 3 is connected to ground. Herein, the memory element may be referred to as cell.

A series circuit of a resistor element Rp and a variable voltage source Vp is connected between the inverting input terminal and the ground, where the resistor element Rp is a memristor. The series circuit corresponds to a current adjuster. Herein, a current flowing from the memory device 1 into the connection point of the resistor element Rp is referred to as Io, where the resistor element Rp is for error detection. A current flowing from the connection point into the input terminal of the sense amplifier 2 is Is. The resistor element Rp is for error detection. The sense amplifier 2 corresponds to a current-to-voltage (I-V) conversion amplifier circuit.

Next, a procedure for error detection to the memory device 1 will be described. As a premise, it is assumed that the conductances of the respective memory elements R1, R2, and R3 are set to values corresponding to their respective stored values. For normal reading from the memory device 1, a controller 23 sets, for example, V1=V2=V3=+Vread, Vp=0 so that no current flows in the error detection resistor element Rp.

For error detection, when the controller 23 sets V1=V2=V3=+Vread, Vp=−Vread for example, the resistance value of the error detection resistor element Rp is set so that the output current Is=0. In this state, if the output voltage of the sense amplifier 2 is detected as Vout≠0, that is, Is≠0 is detected, this indicates that open-circuit failure or short-circuit failure or a change in set resistance value occurs in any of the memory elements R1, R2 and R3.

It is noted that in consideration of measurement accuracy, abnormality may be determined when the output current Is is out of a range of, for example, −Ith1<Is<Ith2. Threshold setting may be made by switching over, for example, applied voltage to Vp, a reference potential of the sense amplifier 2, and/or a resistance value of the resistor element Rp.

Figure 2:
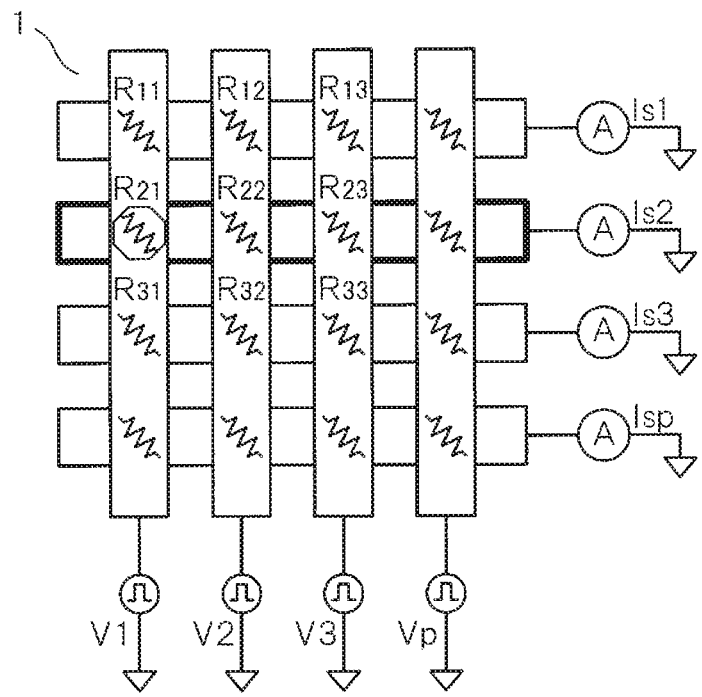
FIG. 2 is a diagram illustrating error detection in a row direction.
Figure 3:
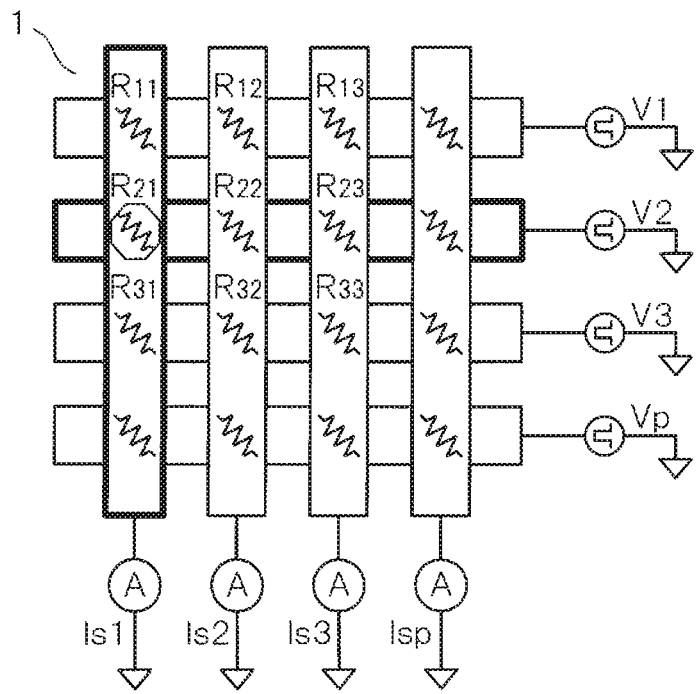
FIG. 3 is a diagram illustrating \error detection in a column direction.

Further, suppose that as shown in FIG. 2 and FIG. 3, the memory elements of memory device 1 are 3×3 memory elements R11 to R33. In this case, resistance elements Rp and voltage sources Vps are arranged in the row direction and column direction to identify in what memory element the abnormality occurred. For example, if Is2≠0 is detected in FIG. 2 and Is1≠0 is detected in FIG. 3, this indicates that abnormality occurred in the memory element R21. Then, upon the controller 23 detecting the abnormality or error, the controller 23 makes adjustment and resetting of the resistance value of the memory element R21 so that Is2=Is1=0, whereby the correction of the error is made.

As described above, the present embodiment includes the memory device 1 in which the memory elements R1 to R3 being the memristors are connected in a matrix. The controller 23 controls the voltage application device for performing writing to one or more selected elements in the memory device 1 to reduce its resistance value and for performing deleting to increase the resistance value of one or more selected elements and for performing reading, where the voltage application device is arranged to apply bias voltages to the memory device 1. The sense amplifier 2 converts the currents flowing via the memory elements R1 to R3 into a voltage and outputs the voltage. The controller 23 adjusts and change the total current value input to the sense amplifier 2 to zero.

The total current value input to the amplifier 2 is determined in accordance with the resistance values of the respective memory elements, where the resistance values are set depending on writing states of the respective memory elements. Therefore, if it is detected that the total current value is not zero after the total current value is adjusted to be zero, it means that there occurs a change in resistance value set to the memory element. Based on this, the abnormality occurrence in the memory device 1 is detectable.

In addition, because the current adjuster is provided as the series circuit of the resistance element Rp and the voltage source Vp and the series circuit is arranged at an input part of the corresponding amplifier 2, the current total value of 0 is achievable by adjusting the resistance value of the resistance element Rp and/or adjusting the voltage of the voltage source Vp. Then, when the controller 23 detects the abnormality occurrence, the error is correctable by the controller 23 resetting the resistance value of the memory element R21 to result in Is2=Is1=0. The controller 23 corresponds to a resistance value adjuster.

Second Embodiment

Figure 4:
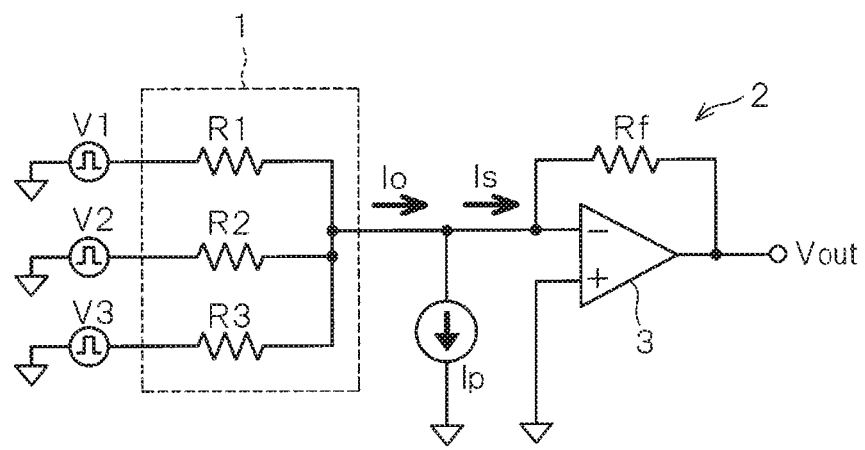
FIG. 4 is a diagram illustrating a configuration for performing error detection to a memory device including memristors in a second embodiment.
Figure 5:
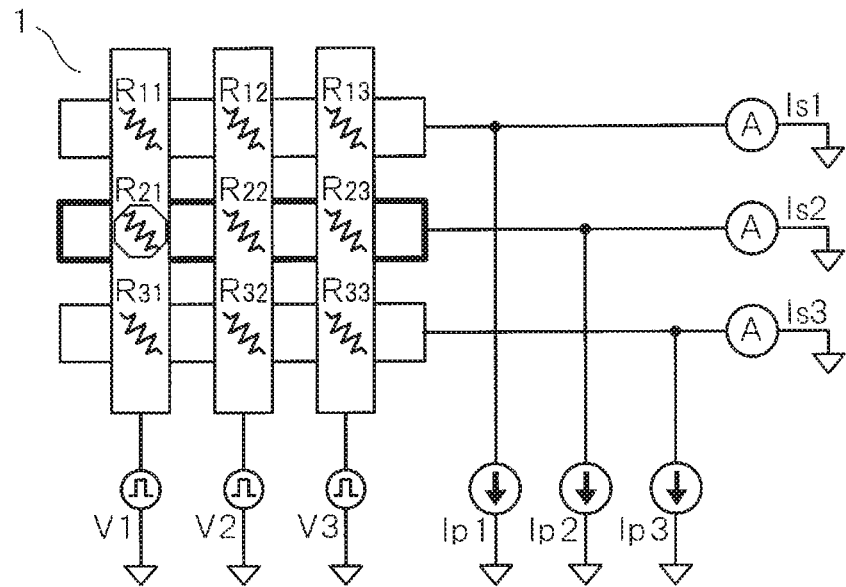
FIG. 5 is a diagram illustrating error detection in a row direction.
Figure 6:
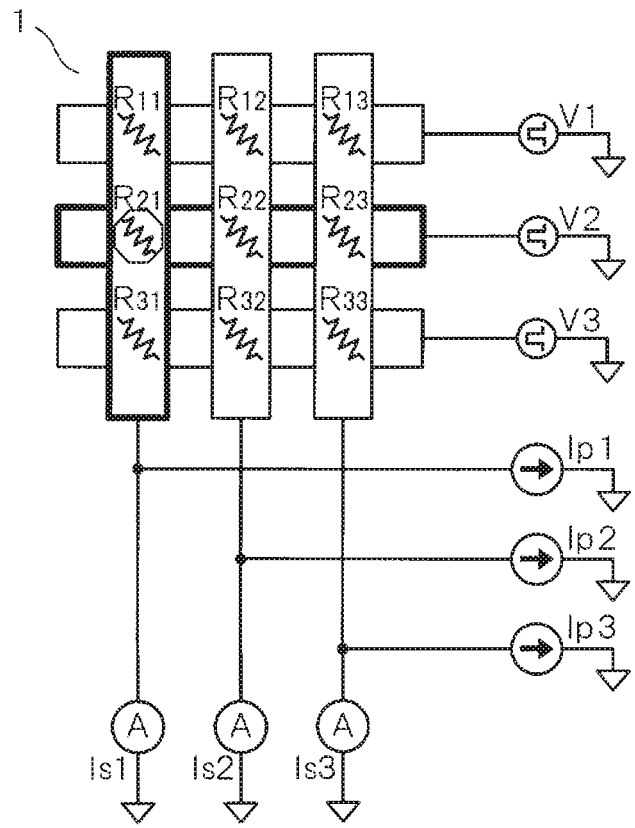
FIG. 6 is a diagram illustrating error detection in a column direction.

Hereinafter, a difference from the first embodiment will be described below in which like references are used to refer to parts to avoid redundant description. As shown in FIG. 4, the second embodiment includes a variable current source Ip in place of the series circuit of the error detection resistor Rp and the variable voltage source Vp. The variable current source Ip corresponds to a current adjuster. In this case, the error detection is made such that like the first embodiment, when the setting of V1=V2=V3=+Vread is made, the current of the current source Ip is set to realize the output current=0. For the normal reading operation, the setting of Ip=0 is made. In the second embodiment also, as shown in FIGS. 5 and 6, the current sources Ip are arranged in the row direction and in the column direction. Accordingly, it is possible to identify in what memory element the abnormality occurred.

Figure 7:
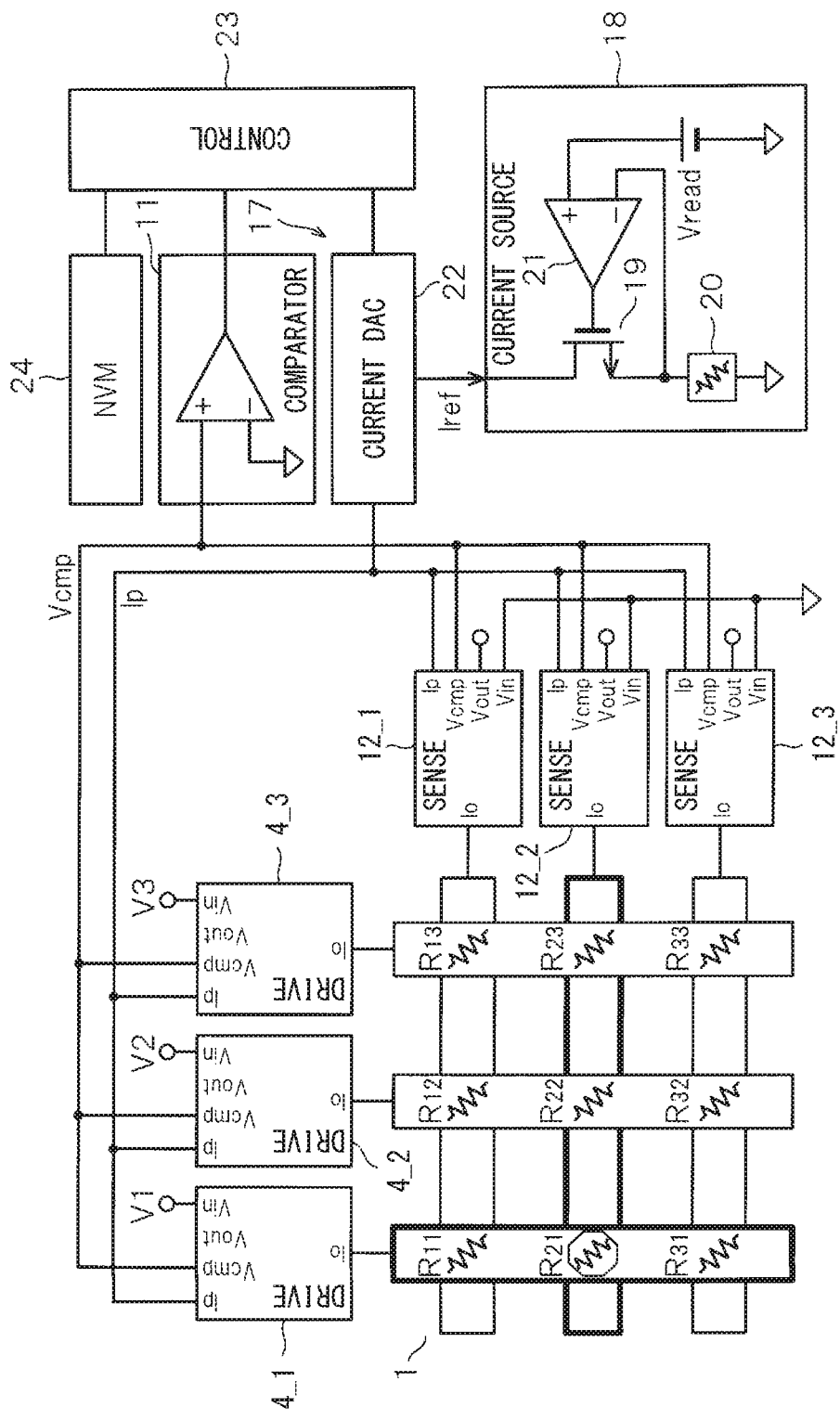
FIG. 7 is a diagram illustrating a practical neural network circuit with a configuration for performing error detection in a row direction.
Figure 8:
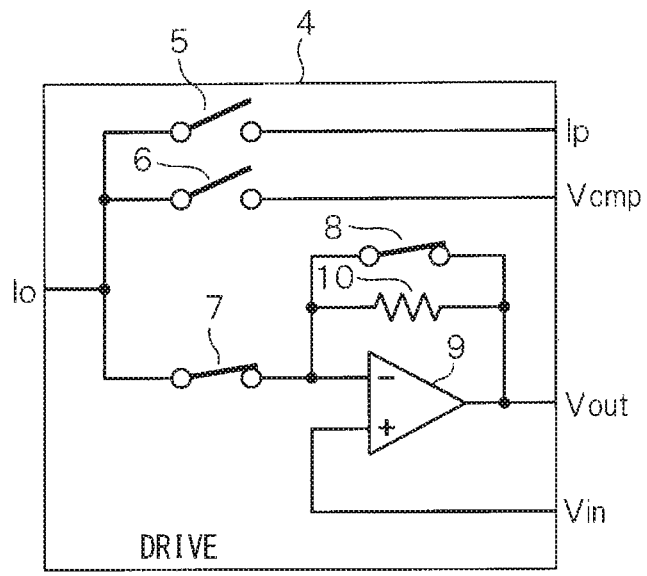
FIG. 8 is a diagram illustrating a configuration of a drive circuit.

As shown in FIG. 7, drive circuits 4_1, 4_2, 4_3 are arranged corresponding to variable voltage sources V1, V2, V3. The drive circuits 4_1, 4_2, 4_3 are arranged to respective columns of the memory device 1. In the present disclosure, each drive circuit 4_1, 4_2, 4_3 may be referred to also as drive circuit 4. As shown in FIG. 8, the drive circuit 4 includes switches 5 to 8 and an operational amplifier 9. First ends of the switches 5 to 7 are commonly connected to the corresponding column of the memory device 1. The voltage from the voltage source V1, V2 and V3 is input to the non-inverting input terminal of the operational amplifier 9.

A second end of the switch 5 is connected to a current source Ip. A second end of the switch 6 is connected to a non-inverting input terminal Vcmp of a comparator 11. A second end of the switch 7 is connected to an inverting input terminal of the operational amplifier 9. The switch 8 is connected in parallel to the feedback resistor 10 of the operational amplifier 9.

Sense circuits 12_1, 12_2, 12_3 are arranged corresponding to the respective rows of the memory device 1. In the present disclosure, each sense circuit 12_1, 12_2, 12_3 may be referred to also as sense circuit 12. Similar to the drive circuit 4, the sense circuit 12 includes switches 14 to 16 and a sense amplifier 2. First ends of switches 13 to 15 are commonly connected to a common connection point that serves as an input terminal of the sense circuit 12. A second end of the switch 13 is connected to the current source Ip. The second end of the switch 14 is connected to the terminal Vcmp. A second end of the switch 15 is connected to an inverting input terminal of the operational amplifier 3. A switch 16 is connected in parallel to a feedback resistor Rf of the operational amplifier 3.

As shown in FIG. 7, a current source circuit 18 constituting a variable current source 17 includes an N-channel MOSFET 19, a memristor 20 and an operational amplifier 21. The drain of the MOSFET 19 is connected to a current D-A (digital-to-analog) converter 22 and the source is connected to ground via a memristor 20. A reference voltage Vread is supplied to a non-inverted input terminal of the operational amplifier 21. An inverting input terminal of the operational amplifier 21 is connected to the source of the MOSFET 19. An output terminal of the operational amplifier 21 is connected to the gate of the MOSFET 19. The drain of the FET 19 is a terminal to sink a reference current Iref. The variable current source 17 corresponds to a current adjuster.

The controller 23 performs control to generate a current Ip (=N×Iref) by the current D-A converter 22 multiplying the reference current Iref of the current source circuit 18 by N, where N is a real number. Each data to be set by the controller 23 is stored in the non-volatile memory 24. The controller 23 corresponds to a current adjuster.

For performing normal reading from the memory device 1, the switches 5 and 6 are turned off and the switches 7 and 8 are turned on in the drive circuits 4 so that the drive circuits 4 functions as a voltage follower. At this time, the voltage applied to Vin is applied to each column of the memory device 1 through the terminal Io. Further, in the sense circuit 12, the switches 13, 14 and 16 are turned off and the switch 15 is turned on so that the sense circuit 12 functions as an I-V (current-to-voltage) amplifier.

For performing error detection the switches 13 and 14 are turned on and the switches 15 and 16 are turned off in the sense circuit 12. As a result, the current Is (=Io−Ip) is output to the comparator 11. If the current Is≠0, this current is converted into a voltage Vcmp due to a high input resistance of the comparator 11. Accordingly, the controller 23 detects the error occurrence through the output of the comparator 11.

Figure 9:
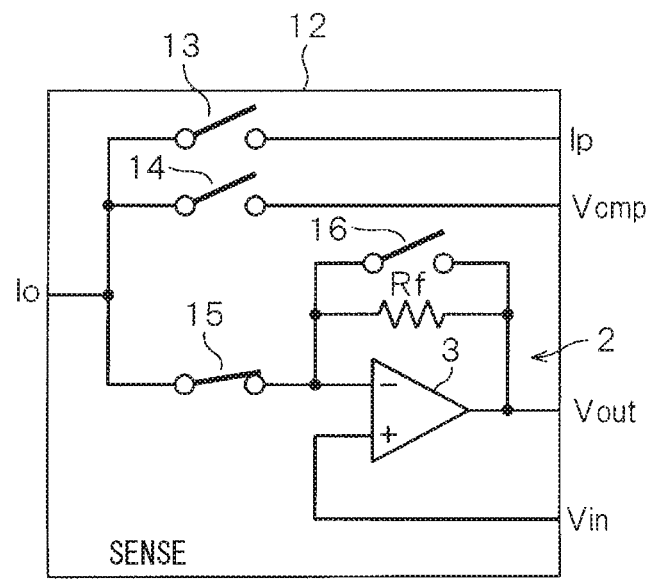
FIG. 9 is a diagram illustrating a configuration of a sense circuit.

Further, as shown in FIGS. 8 and 9, since drive circuit 4 and sense circuit 12 are symmetrical in configuration, it is possible for the sense circuits 12 to function as the drive circuits in the row direction and for the drive circuits 4 to function as the sense circuits in the column direction, so that the reading and the error detection are performable in the way as described.

In the second embodiment, the variable current sources Ip and 17 are arranged instead of the series circuit of the error detection resistor Rp and the variable voltage source Vp. Specifically, when the error detection resistance element Rp is used as in the first embodiment, there is a possibility that the resistance value of the resistance element Rp may vary due to the influence of disturbance. In this regard however, when the variable current source Ip is used as in the second embodiment, the influence of disturbance is eliminatable. Furthermore, since the current source circuit 18 includes the memristor 20 so that the temperature characteristic of the reference current Iref becomes equal to the temperature characteristic of the input current Io, the influence of the temperature on the resistance value is minimized.

If there is a concern about the long-term reliability of the memristor 20, the memristor 20 may be used in combination with a PTAT (proportional to absolute temperature) circuit or the like.

Third Embodiment

Figure 10:
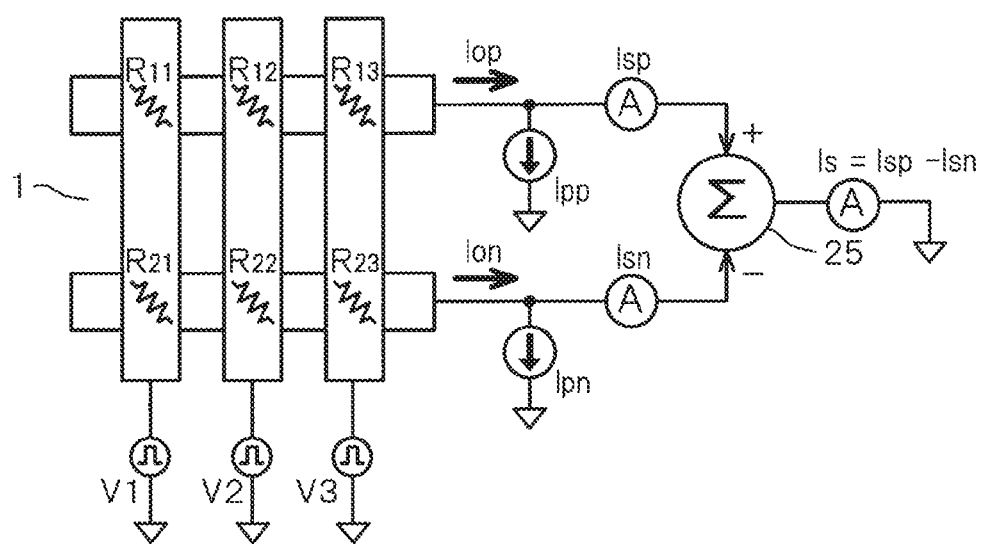
FIG. 10 is a diagram illustrating a configuration for performing error detection to a memory device including memristors in a third embodiment.

As shown in FIG. 10, the third embodiment performs error detection using the current source Ip as in the second embodiment. To do so, variable current sources Ipp and Ipn are respectively applied to the first and second rows of the memory device 1 to perform parallel error detection and a subtractor 25 compares the current difference between the first and second rows. Specifically, defining that a detection result of current of the first row is Isp and a detection result of current of the second row is Isn, the output current Is of the subtractor 25 is Is=Isp−Isn. The subtractor 25 corresponds to a differential operation device.

Next, an operation of the third embodiment will be described. For error detection, the output current Is of the subtractor 25 is first checked, and it is determined whether Is=0. When Is=0, this means that there is no abnormality in the first and second rows. When if Is≠0, Isp and Isn are checked, and it is determined whether they are not "0" and it is identified in which row there is abnormality. After that, the same is performed to the columns. Then, an abnormal cell is identified.

In the third embodiment, it is possible to promptly perform the error detection by the subtractor 25 providing a difference between the detection currents Isp and Isn obtained through the two variable current sources Ipp and Ipn.

Fourth Embodiment

Figure 11:
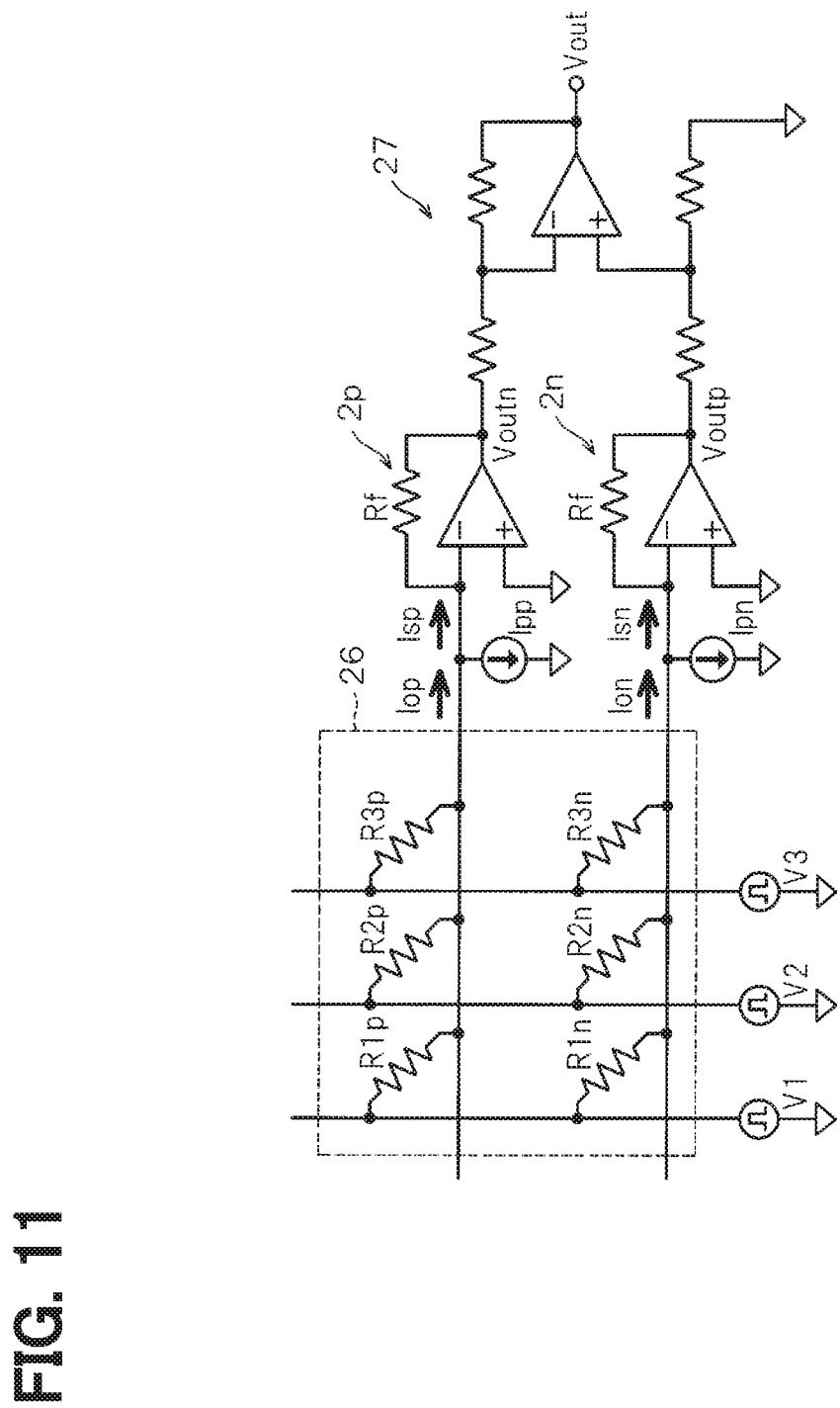
FIG. 11 is a diagram illustrating a configuration for performing error detection to a memory device including memristors in a fourth embodiment.

As shown in FIG. 11, the fourth embodiment includes a memory device 26 having a differential configuration. The forth embodiment uses the current sources Ipp and Ipn as in the third embodiment and performs error detection for each of the positive side and the negative side in the same row. The output terminals of a positive side sense amplifier 2p and a negative side sense amplifier 2n, respectively, are connected to a negative side input terminal and a positive side input terminal of a differential amplifier circuit 27. Using the memory device 26 having the differential configuration, the fourth embodiment takes measures against such difficulty that the error cell is non-writable because the resistance value of the error cell is its maximum or minimum.

As shown in FIG. 12, it is assumed that Ipp=100 μA and Ipn=10 μA, which correspond to the initial setting of the resistance value, are stored in the memory. A first case is a case where the resistance value of an error cell R1p is the minimum. A second case is a case where the resistance value of the error cell R1p is the maximum. A third case is a case where the resistance value of an error cell R1n is the minimum. A fourth case is a case where the resistance value of the error cell R1n is the maximum. In the fourth embodiment, correction targets are the first cases and the fourth case.

Figure 13:
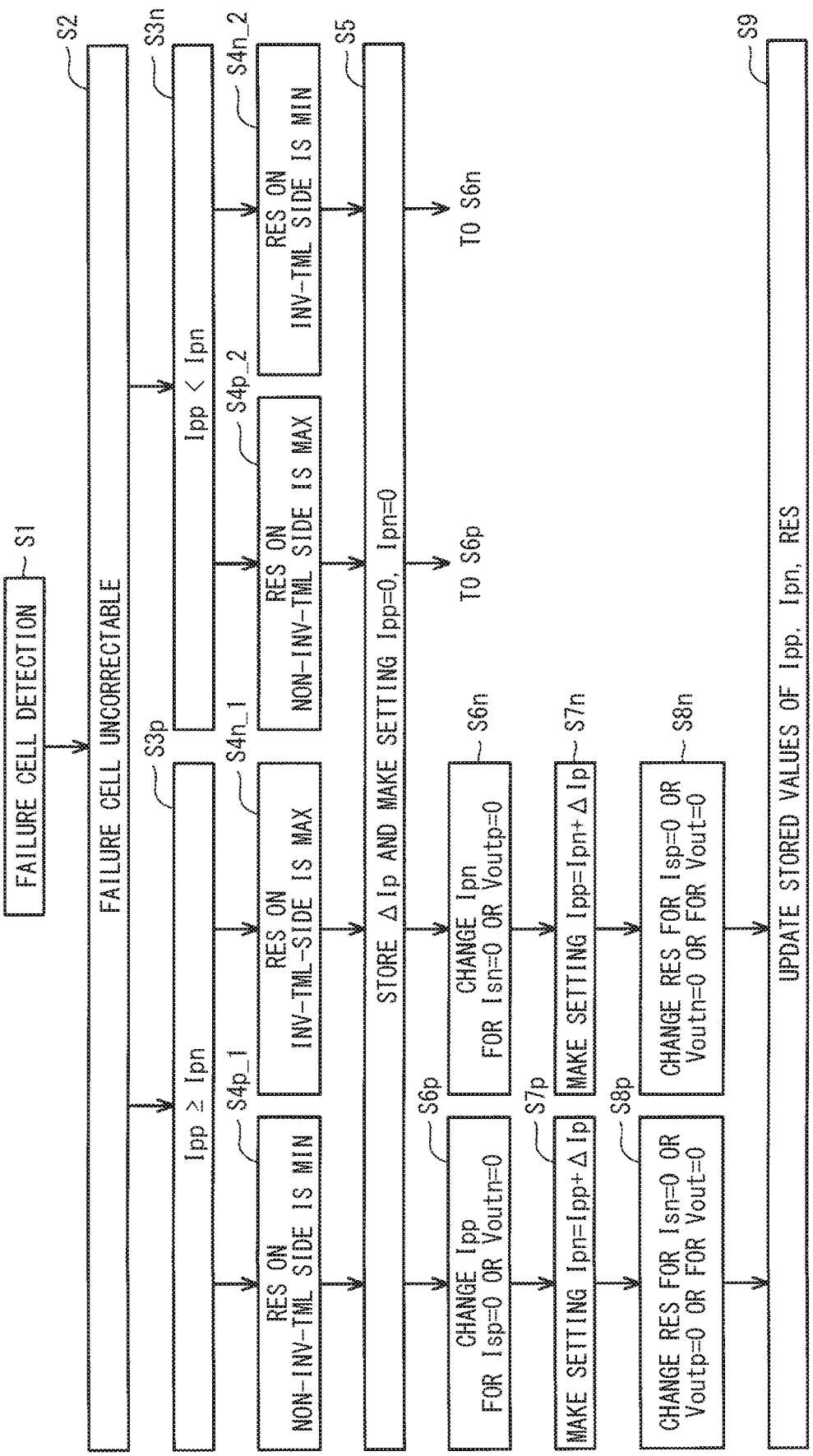
FIG. 13 is a flowchart illustrating an error correction process.

As shown in FIG. 13, it is assumed that the cell in which the failure is detected is R1p or R1n (S1), and that the resistance value of the failure cell matches the first case or the fourth case. When the resistance value matches the first case, a relation Ipp≥Ipn is satisfied (S3p), and the resistance value on the positive side input terminal side (non-inverting input terminal side) of the differential amplifier circuit 27 is fixed to the minimum value (S4p_1). The difference Ipp−Ipn is calculated from the values of Ipp and Ipn stored in the memory, and the calculated difference with the inverted polarity is given as ΔIp (=−90 μA). Then, ΔIp (=−90 μA) is recorded and setting of current cells are made to have Ipp=Ipn=0 (S5).

Next, the value of Ipp is changed so to achieve the positive side Isp=0 or Voutn=0 (S6p). The resultant Ipp is assumed to be Ipp=1000 μA. Then, the setting of Ipn is made to have Ipn=Ipp+ΔIp=1000 μA−90 μA=910 μA (S7p), whereby, the value of (Ipp-Ipn) is equal to the initial setting value. Then, when the value of the cell R1n on the inverting input terminal side is changed so that the negative side Isn=0 or Voutp=0 is given or so that Vout=0 is given (S8p), the data values of Ipp, Ipn, and the resistance value data of each cell stored in the memory are updated (S9).

In FIG. 13, step S4n_1 and steps S6n to S8n are processes corresponding to the fourth case 4. Steps S3n to S4p_2 and S3n to S4n_2 are the cases where Ipp<Ipn is met and the resistance value is the same as in the second case and the third case. These cases can be handled in the same manners as in the first and fourth cases.

As described above, the fourth embodiment includes the memory device 26 having a differential configuration and the differential operation circuit 27 for calculating (providing) a difference between outputs of two sense amplifiers constituting a differential pair. Then, if the difference is not zero, the resistance value of the corresponding cell is adjusted so as to make the difference zero. Therefore, the error is correctable utilizing the differential configuration of the memory device 26. The flowchart shown in FIG. 13 may be performed by controller 23, 31.

Fifth Embodiment

Figure 14:
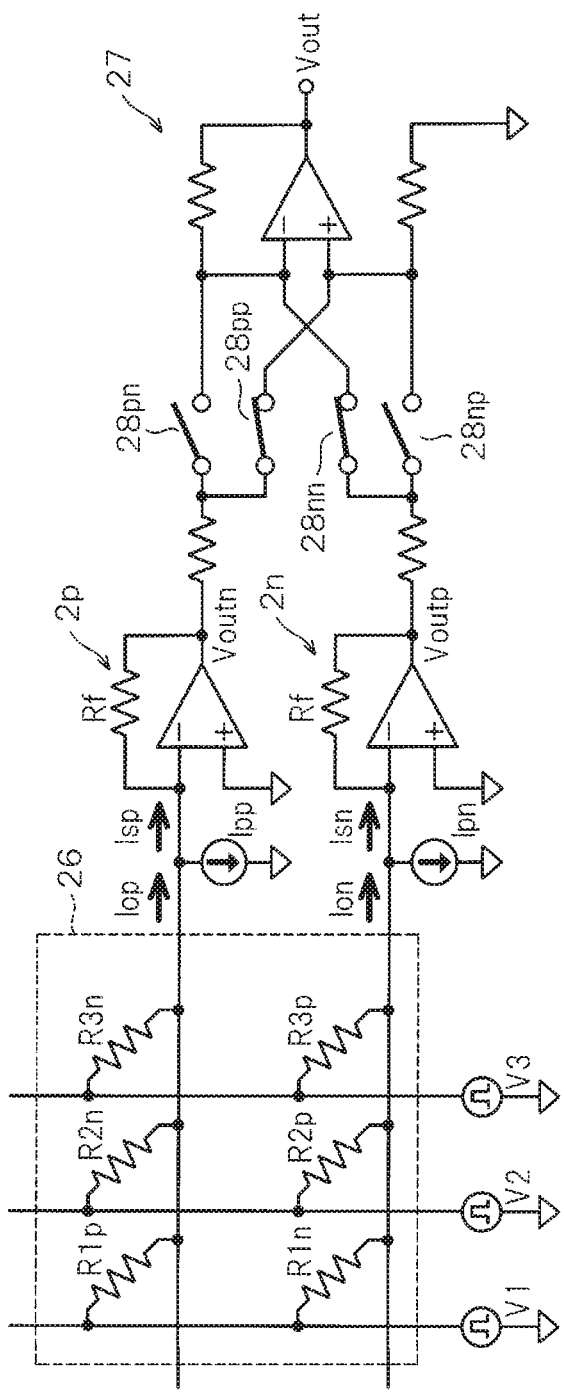
FIG. 14 is a diagram illustrating a configuration for performing error detection to a memory device including memristors in a fifth embodiment.

As shown in FIG. 14, the fifth embodiment adds four switches 28pn, 28pp, 28nn, 28np to the differential amplifier circuit 27 of the fourth embodiment, for interchanging the positive side input terminal and the negative side input terminal. With this configuration, the fifth embodiment performs processes to handle the second and third cases, which cases are uncorrectable cases in the fourth embodiment. It is noted that in stead of the current values Ipp and Ipn, FIG. 15 shows conductance values gm_R1p and gm_R1n of the cells R1p and R1n and a difference in conductance value is shown as Δgm.

Figure 16:
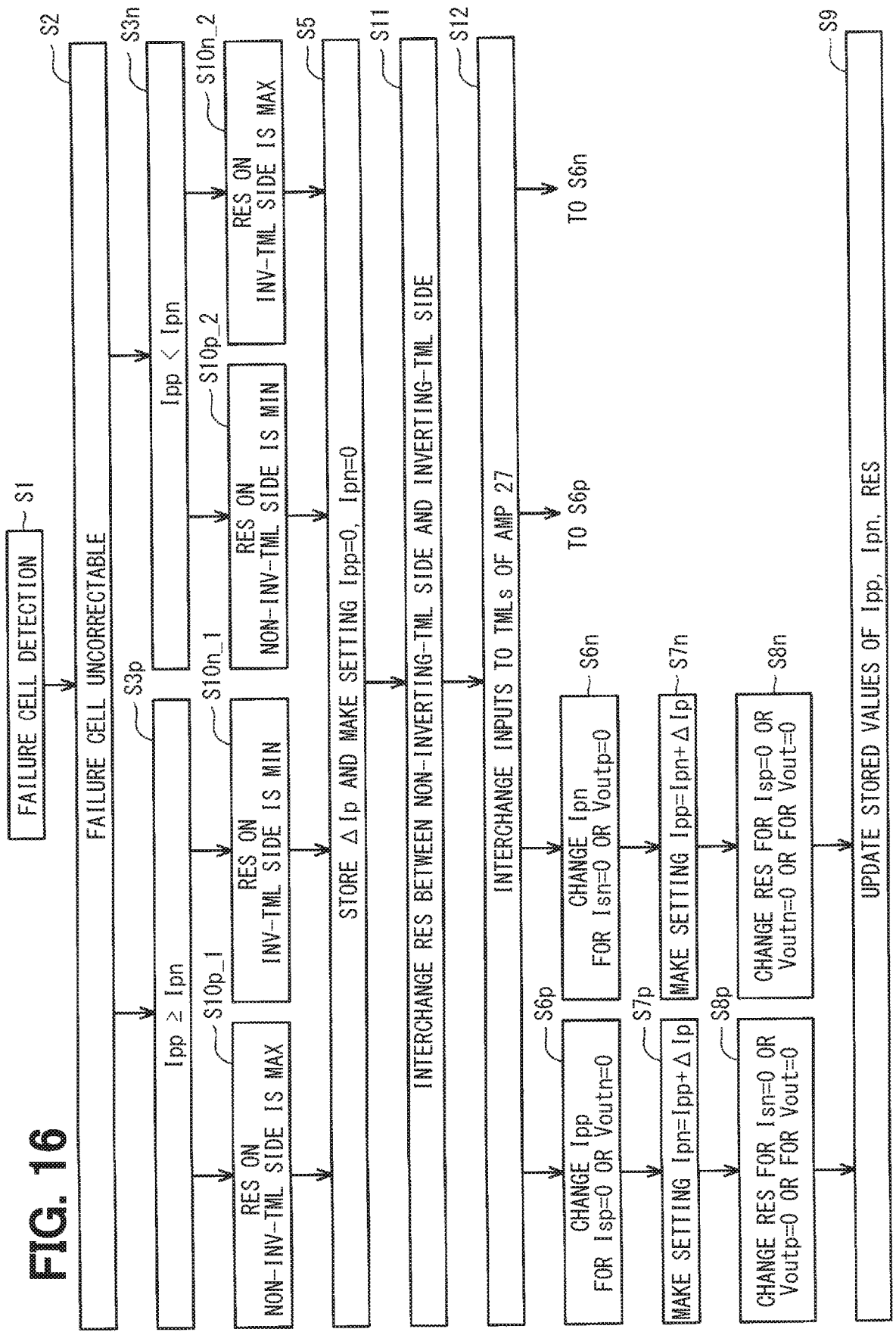
FIG. 16 is a flowchart illustrating an error correction process.

In the flowchart shown in FIG. 16, steps S4p_1, S4n_1, S4p_2 and S4n_2 are replaced with step S10p_1, S10n1, S10p_2, S10n_2, respectively. Differences of steps S10p_1 and S10p_2 from S4p_1 and S4p_2 are such that in S10p_1 and S10p_2 the resistance value is fixed to maximum whereas in steps S4p_1 and S4p_2, the resistance value is fixed to minimum. Differences of steps S10n_1 and S10n_2 from S4n_1 and S4n_2 are such that in S10n_1 and S10n_2 the resistance value is fixed to minimum whereas in steps S4n_1 and S4n_2, the resistance value is fixed to maximum. In this way, the maximum and the minimum are reversed between the fourth embodiment and the fifth embodiment. This reverse causes the second and third cases. Furthermore, steps S11 and S12 are executed between S5 and S6p and between S5 and S6n. In step S11, the positive side resistance value and the negative side resistance value are rewritten so that they are interchanged. Accordingly, the second case is changed into the fourth case and the resistance value is adjustable on the cell R1p side. Likewise, since the third case is changed into the first case, the resistance value is adjustable on the cell R1n side.

In step S12, the switches 28pp and 28nn are turned on to interchange the positive side input terminal and the negative side input terminal of the differential amplifier circuit 27. Specifically, the conductance difference Δgm in the second and third cases shown in FIG. 13 becomes −90 μS because of the adjustment up to step S8, provided that the positive side input terminal and the negative input terminal are not interchanged. Then, when the positive side input terminal and the negative input terminal are interchanged, the resultant difference Δgm=90 μS is given.

In the above fifth embodiment, the differential amplifier circuit 27 is configured such that the positive side input terminal and the negative side input terminal are interchangeable. The fifth embodiments performs rewriting so as to interchange the resistance value of the cell connected to the positive side input terminal and the resistance value of the cell connected to the negative side input terminal. Then, the positive side input terminal and the negative side input terminal are interchanged, so that the adjustment is made to make the absolute value of the difference zero. Accordingly, the second and third cases, which are uncorrectable in the fourth embodiment, are corrected. The flowchart shown in FIG. 16 may be performed by the controller 23, 31. The controller 23, 31 corresponds to an absolute value adjuster.

Sixth Embodiment

The fourth or fifth embodiment can make correction on the error-detected cell. However, the fourth and fifth embodiments may involve electrical energy increase and reliability reduction. The present embodiment addresses this difficulty. When priority is given to avoiding the difficulty, it may be desirable to invalidate the column including the error cell and replace this invalidated column with a spare cell column.

Figure 17:
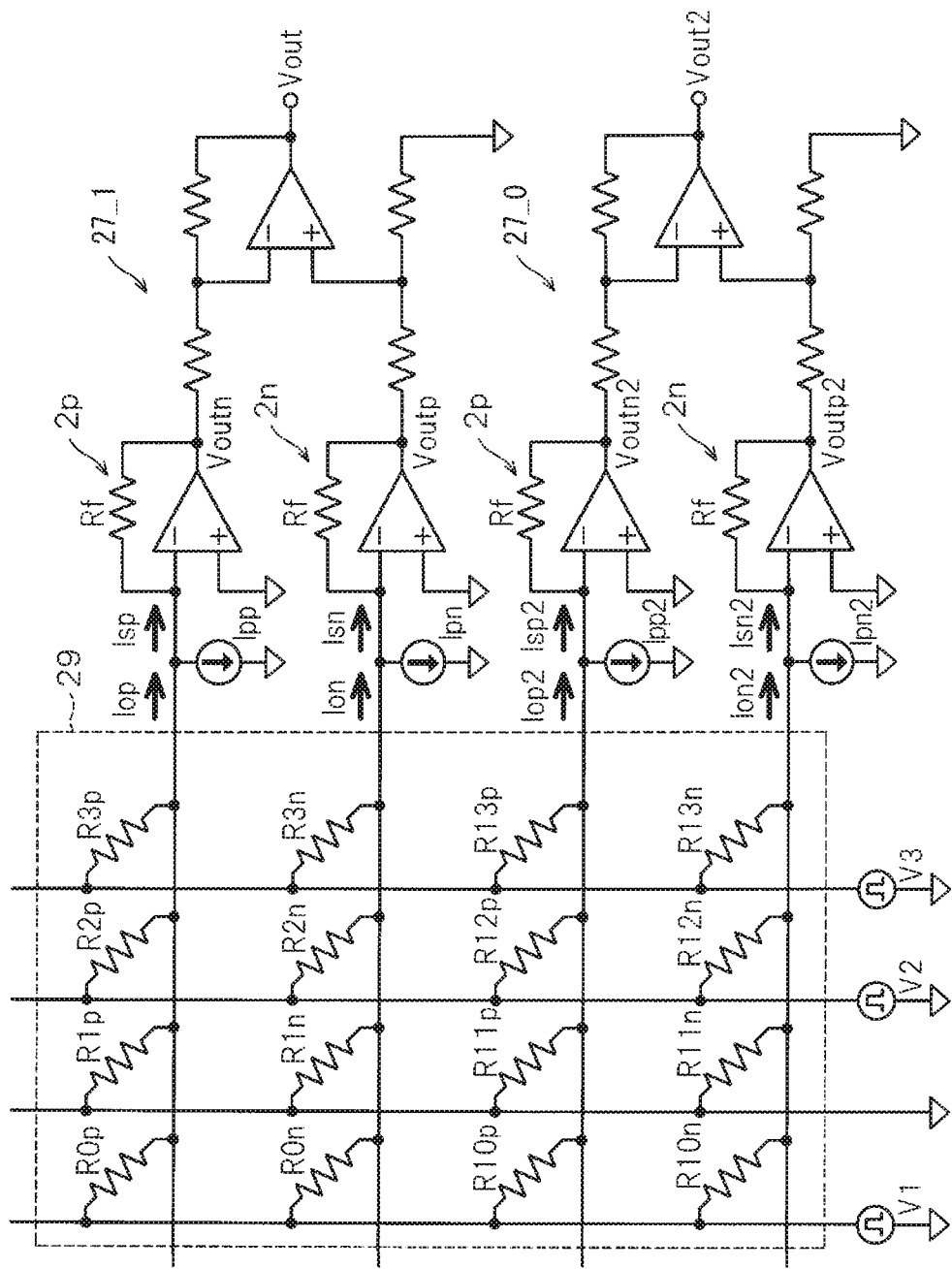
FIG. 17 is a diagram illustrating a configuration for performing error detection to a memory device including memristors in a sixth embodiment.

A memory device 29 illustrated in FIG. 17 includes cells R11p to R13p and R11n to R13n as spare rows, which spare rows correspond to the cells R1p to R3p on the positive side and the cells R1n to R3n on the negative side. Further, cells R0p, R0n, R10p, and R10n are provided as spare cells in the row direction.

Figure 19:
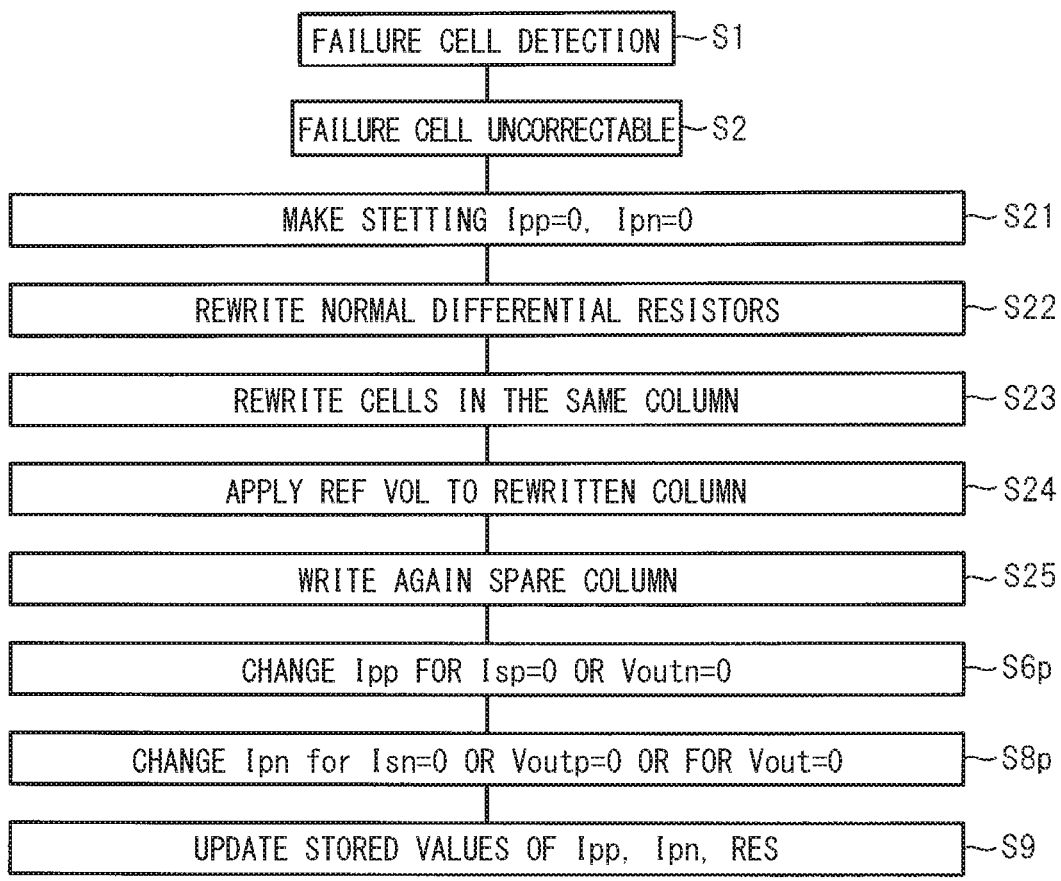
FIG. 19 is a flowchart illustrating an error correction process.

Next, the operation of the sixth embodiment will be described. As shown in FIG. 19, after execution of step S2, steps S21 to S25 are performed. A faulty cell is R1p or R1n, which corresponds to all the first to fourth cases in the fourth or fifth embodiment. The setting is made to have the current Ipp=Ipn=0 of the differential pair having the faulty cell (S21). Then, the pair of differential resistors is rewritten so that if the faulty cell is R1p, the resistance value of the cell R1n is rewritten to the same value as the resistance value Rmin or Rmax of the faulty cell (S22). As a result, the respective cells have the conductance values shown in FIG. 18.

Next, the resistance values of the pair of differential resistors, for example, the cells R11p and R11n connected to the same column except the pair of R1n and R1p are rewritten to the maximum value to invalidate this column (S23). A reference voltage is applied to the invalidated column so that the currents do not flow in the invalidated column (S24). Then, the initial resistance values of the cells R1p and R1n are written to the spare column R0p to R10n (S25). After that, steps S6p, S8p and S9 are executed.

Figure 20:
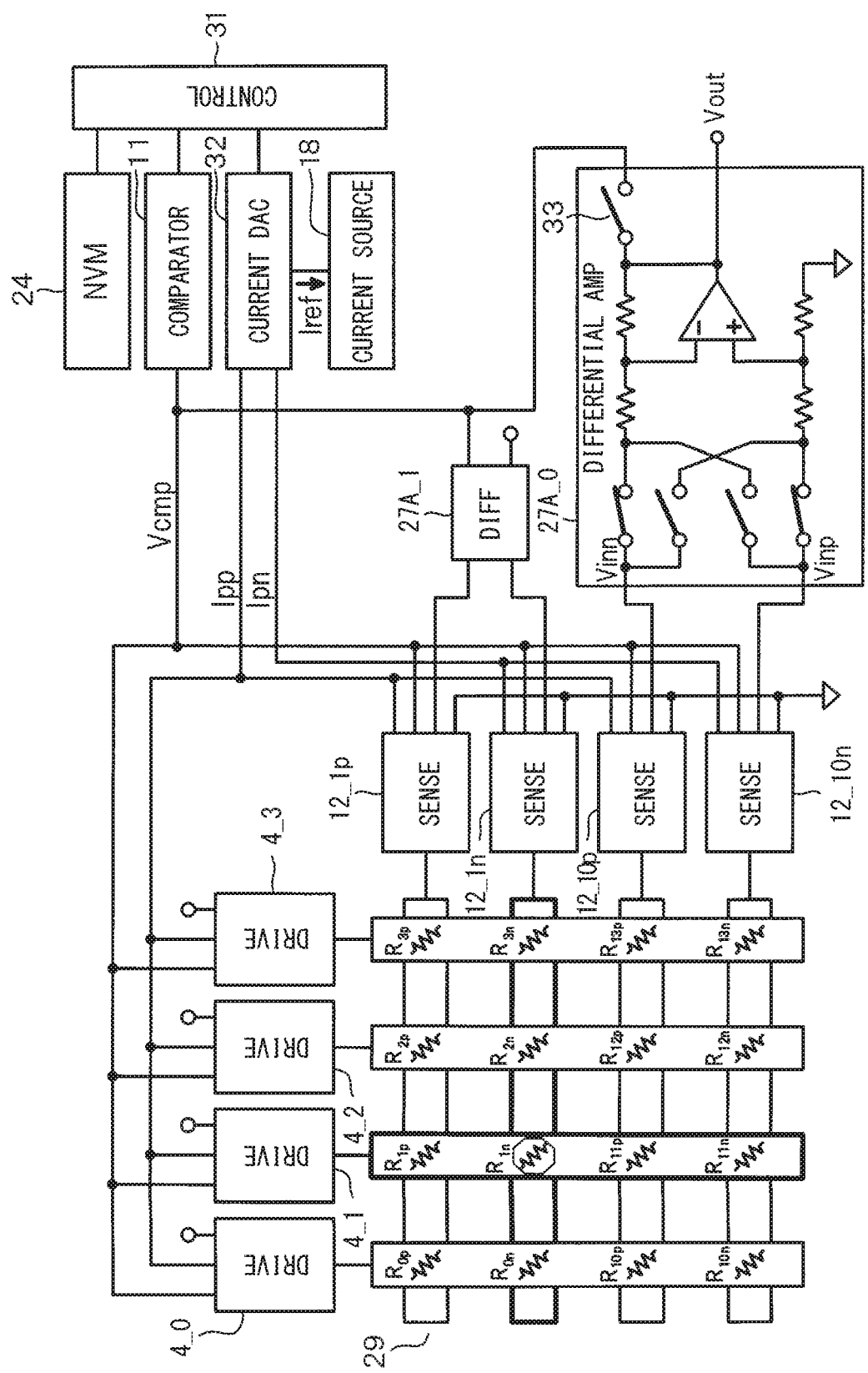
FIG. 20 is a diagram illustrating a practical neural network circuit with a configuration for replacing with a spare cell column.

In the configuration shown in FIG. 20 corresponding to FIG. 7, a drive circuit 4_0 is arranged corresponding to the spare cell row. Sense circuits 12_1p and 12_1n are arranged corresponding to a differential pair. Sense circuits 12_10p and 12_10n are arranged corresponding to another differential pair. A current D-to-A converter 32 generates a positive side current Ipp and a negative side current Ipn based on a reference voltage Iref.

A differential amplifier circuit 27A has a configuration in which a switch 33 for output separation is provided between an output terminal of a differential amplifier circuit 27 and an input terminal of a comparator 11. The input terminals of the differential amplifier circuit 27A_1 are respectively connected to the output terminals of the sense circuits 12_1p and 12_1n, and the input terminals of the differential amplifier circuit 27A_0 are respectively connected to the output terminals of the sense circuits 12_10p, 12_10n. The controller 31 corresponds to an abnormality handling device.

As described above, the sixth embodiment includes spare cells R0p, R0n, R10p, and R10n to be replaced with the differential cells in which the abnormality is detected. If the difference between the outputs of sense amplifiers 2p and 2n detected by the differential amplifier circuit 27 is not zero, the controller 31 corresponding to a resistance value adjuster makes adjustment so as to make the resistance values of corresponding differential cells equal to each other. Then, except for the above differential cells, the resistance values of the differential cells connected to the same input terminal of the sense amplifiers 2 are changed to the maximum value by the controller 31, and the differential cells in which the abnormality is detected is replaced with the corresponding spare cells by the controller 31. Because of this, the increase in power consumption is avoidable. In addition, the memory device 29 is maintainable without reliability reduction.

Moreover, the replacement with the spare cells may be performed in cases where, like the fourth or fifth embodiments, the error is uncorrectable even though the resistance value in the memory device is adjusted as a result of the correction on the error detected cell.

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

It is noted that a flowchart or the processing of the flowchart in the present application includes sections (also referred to as steps), each of which is represented, for instance, as S101. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A neural network circuit comprising:
    a memory device including memristors being variable resistance elements connected in a matrix, wherein the memristors act as memory elements and resistance values of the memristors provide data of the memory device;
    a voltage application device arranged to apply bias voltages to the memory device;
    a controller arranged to control the voltage application device to perform writing, deleting and reading the data in the memory device, wherein the writing reduces the resistance value of one or more of the memory elements and the deleting increases the resistance value of one or more of memory elements;

a plurality of current-to-voltage (I-V) conversion amplifier circuits arranged to convert currents flowing through the memory elements into voltages and outputting the voltages; and a plurality of current adjusters respectively corresponding to the plurality of I-V conversion amplification circuits, each current adjuster being arranged to adjust a total current value input to a corresponding I-V conversion amplification circuit to zero.

2. The neural network circuit according to claim 1, wherein
the current adjuster includes a current source arranged at an input part of the corresponding I-V conversion amplification circuit.

3. The neural network circuit according to claim 2, wherein
a temperature characteristic of a reference current flowing inside the current source is set equal to a temperature characteristic of an input current of the I-V conversion amplification circuit.

4. The neural network circuit according to claim 1, wherein
the current adjuster includes a series circuit of a resistance element and a voltage source, the series circuit being arranged at an input part of the corresponding I-V conversion amplification circuit.

5. The neural network circuit according to claim 1, further comprising
a resistance value adjuster arranged to reset a resistance value of a corresponding memory element in cases where: after adjustment is performed with the current adjuster, it is detected that the total current value is not zero.

6. The neural network circuit according to claim 1, further comprising
a differential operation device arranged to provide a difference between outputs of any two of the current adjusters.

7. The neural network circuit according to claim 1, wherein
the memory device has a differential configuration,
the neural network circuit further comprising
a differential operation device arranged to provide a difference between outputs of two of the I-V conversion amplifier circuits constituting a differential pair.

8. The neural network circuit according to claim 7, further comprising
a resistance value adjuster arranged to, if the difference is not zero, adjust the resistance value of the memory elements corresponding to the differential pair to make the difference zero.

9. The neural network circuit according to claim 8, further comprising
an absolute value adjuster arranged to make adjustment to make an absolute value of the difference zero when it is unable to make the adjustment using the resistance value adjuster.

10. The neural network circuit according to claim 9, wherein:
the differential operation device includes a positive side input terminal and a negative side input terminal and is arranged to enable the positive side input terminal to act as the negative side input terminal and the negative side input terminal to act as the positive side input terminal;
the absolute value adjuster performs rewriting so as to interchange a resistance value of a memory element connected to the positive side input terminal and a resistance value of a memory element connected to the negative side input terminal; and
the absolute value adjustment makes the absolute value of the difference zero through causing the positive side input terminal and the negative side input terminal, respectively, to act as the negative side input terminal and the positive side input terminal.

11. The neural network circuit according to claim 7, further comprising:
spare memory elements to be replaced with differential memory elements including an abnormality-detected memory element, wherein when the difference between the outputs is not zero, the resistances of the differential memory elements are adjusted to be equal to each other; and
an abnormality handling device arranged to replace the differential memory elements including the abnormality-detected memory element with the spare memory elements through setting the resistance values of the differential memory elements connected to the same input terminal to a maximum value except for the abnormality-detected memory element.

12. The neural network circuit according to claim 11, further comprising:
a resistance value adjuster that, when the difference between the outputs is not zero, adjusts the resistance value of the abnormality-detected memory element so as to make the difference zero,
when it is unable to make the adjustment with the resistance value adjuster, the abnormality handling device replaces the differential memory elements including the abnormality-detected memory element with the spare memory elements.

* * * * *